(12) United States Patent
Gopinath et al.

(10) Patent No.: US 11,171,467 B2
(45) Date of Patent: Nov. 9, 2021

(54) COMPACT DIODE LASER SOURCE

(71) Applicant: The Regents of the University of Colorado, a body corporate, Denver, CO (US)

(72) Inventors: Juliet T Gopinath, Boulder, CO (US); Robert D. Niederriter, Los Angeles, CA (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 259 days.

(21) Appl. No.: 16/412,361

(22) Filed: May 14, 2019

(65) Prior Publication Data

US 2019/0280453 A1  Sep. 12, 2019

Related U.S. Application Data

(63) Continuation-in-part of application No. PCT/US2017/061533, filed on Nov. 14, 2017.

(Continued)

(51) Int. Cl.
*H01S 3/10* (2006.01)
*H01S 5/062* (2006.01)
(Continued)

(52) U.S. Cl.
CPC ...... *H01S 5/06216* (2013.01); *H01S 3/10084* (2013.01); *H01S 3/10092* (2013.01); *H01S 3/11* (2013.01); *H01S 5/0057* (2013.01); *H01S 5/0085* (2013.01); *H01S 5/065* (2013.01); *H01S 5/06246* (2013.01); *G01N 21/6458* (2013.01); *H01S 3/0057* (2013.01); *H01S 3/0078* (2013.01); *H01S 3/06758* (2013.01); *H01S 3/0912* (2013.01); *H01S 3/0941* (2013.01);
(Continued)

(58) Field of Classification Search
CPC .... H01S 5/065; H01S 5/06216; H01S 5/0085; H01S 5/0057; H01S 5/06246; H01S 3/0057; H01S 3/06758; H01S 3/0912; H01S 3/1003; H01S 3/107; H01S 3/10084; H01S 3/10092; H01S 3/11
See application file for complete search history.

(56) References Cited

U.S. PATENT DOCUMENTS 6,046,642 A  4/2000 Brayton et al.
6,639,470 B1  10/2003 Andrys et al.
(Continued)

OTHER PUBLICATIONS

Bias Circuits for GaAs HBT Power Amplifiers, Jarvinen et al., IEEE MTT-S Digest, 2001.

*Primary Examiner* — Kinam Park
(74) *Attorney, Agent, or Firm* — Macheledt Bales LLP; Jennifer L. Bales

(57) ABSTRACT

A compact diode laser achieves high-power, short duration output pulses by separating the lasing action from the pulse-generating mechanism. A diode seed source is configured for gain-switching via a variable RF source. A time lens element includes an intensity modulation device, a phase modulation device, and a pulse compressor. The intensity modulation device carves shorter pulses from the long gain-switched seed pulses, the phase modulation device adds chirp, and the pulse compressor compensates for the chirp while producing high-power short-duration output pulses.

21 Claims, 4 Drawing Sheets

Related U.S. Application Data

(60) Provisional application No. 62/421,523, filed on Nov. 14, 2016.

(51) Int. Cl.
| | | |
|---|---|---|
| *H01S 5/00* | (2006.01) | |
| *H01S 5/065* | (2006.01) | |
| *H01S 3/11* | (2006.01) | |
| *H01S 3/00* | (2006.01) | |
| *H01S 3/091* | (2006.01) | |
| *H01S 3/0941* | (2006.01) | |
| *H01S 3/102* | (2006.01) | |
| *H01S 3/107* | (2006.01) | |
| *H01S 3/23* | (2006.01) | |
| *H01S 3/067* | (2006.01) | |
| *G01N 21/64* | (2006.01) | |
| *H01S 3/16* | (2006.01) | |

(52) U.S. Cl.
CPC ............. *H01S 3/1003* (2013.01); *H01S 3/107* (2013.01); *H01S 3/1024* (2013.01); *H01S 3/1618* (2013.01); *H01S 3/2316* (2013.01); *H01S 3/2375* (2013.01); *H01S 5/0064* (2013.01)

(56) References Cited

U.S. PATENT DOCUMENTS

| | | | |
|---|---|---|---|
| 7,554,395 | B1 | 6/2009 | Pennec |
| 8,150,271 | B1 | 4/2012 | Brennan et al. |
| 9,236,707 | B1 * | 1/2016 | Desbiens ............ H01S 5/06216 |
| 2004/0263959 | A1 | 12/2004 | Dixon et al. |
| 2005/0068107 | A1 | 3/2005 | Bachhuber et al. |
| 2007/0273448 | A1 | 11/2007 | Vauana et al. |
| 2007/0280613 | A1 * | 12/2007 | Inoue ...................... G02F 1/365 |
| | | | 385/122 |
| 2009/0323741 | A1 * | 12/2009 | Deladurantaye ....... B23K 26/40 |
| | | | 372/25 |
| 2011/0284507 | A1 * | 11/2011 | Deladurantaye .... H01S 5/06835 |
| | | | 219/121.62 |
| 2014/0218789 | A1 | 8/2014 | Clowes et al. |
| 2015/0255942 | A1 | 9/2015 | Fermann et al. |
| 2015/0311666 | A1 * | 10/2015 | Fermann ............ H01S 3/06754 |
| | | | 250/281 |

* cited by examiner

COMPACT DIODE LASER SOURCE

This invention was made with government support under grant number IDBR1353757 awarded by the National Science Foundation. The government has certain rights in the invention.

BACKGROUND OF THE INVENTION

Field of the Invention

The present invention relates to a compact semiconductor laser source. In particular, the present invention relates to a compact diode pulsed laser source incorporating gain-switching and time-lens pulse compression.

Discussion of Related Art

Currently, short pulses are generated by modelocking from a single gain medium, in which an element in the laser cavity adds intensity dependent loss such as a modulator, saturable absorber, or Kerr media combined with a polarizer or soft aperture. The active or passive modelockers favor a pulsed state (higher peak power) over a continuous wave state and lock a series of cavity frequencies in phase, generating a short pulse in the time domain. Combined with dispersion management, modelockers can be used to routinely generate sub-10 fs pulses from solid-state lasers, tens of femtoseconds from fiber lasers, and hundreds of femtoseconds from diode lasers. The pulse width will be constrained by the gain bandwidth and dispersion management and the repetition rate will be set by the upper-state lifetime and cavity length. To achieve large spectral coverage with watt-level output powers with diffraction limited beam quality, solid-state lasers must be used. As such, one of the most versatile choices is the Ti:sapphire laser, producing pulses as short as 6 fs with large output powers (hundreds of mW). Unfortunately, Ti:sapphire lasers require prohibitively expensive green pump lasers, tabletop setups, and have low optical-to-electrical efficiencies.

The diode laser is one of the most successful optical technologies ever developed, with lasers sold for a few cents for common consumer electronics such as compact disc and blue ray players and often used in communication systems. However, diode lasers are fundamentally limited in their ability to compete with other laser technologies in the area of short optical pulses with large average powers (>1 W) and diffraction-limited beam quality. Gain dispersion, gain saturation, and nonlinearities constrain the lasers. Unfortunately, this regime is obviously quite important for any kind of nonlinear optical phenomena.

Multiphoton microscopy is a powerful technique for in vivo imaging of biological tissue. Long-wavelength excitation takes advantage of nonlinear optical processes in fluorophores and allows imaging deeper than 1 mm within intact tissue. The depth penetration of multiphoton microscopy allows investigations of biological structure and function. Optical recording of the activation of neurons in vivo using fluorescent indicators such as GCaMP6 is an especially interesting area of research.

In vivo imaging of freely moving animals provides a wealth of information compared to fixed-head experiments. However, studies of freely moving animal behavior require miniaturized microscope and laser systems implanted or attached to the animal. In addition, these devices can find use in human-prosthetic interfaces. One of the major roadblocks is the lack of a compact and efficient pulsed laser source. The main challenge of nonlinear imaging in miniature microscopes is the high peak power required, typically on the order of several kW.

A need remains in the art for a compact diode pulsed laser source incorporating gain-switching and time-lens pulse compression.

SUMMARY OF THE INVENTION

It is an object of the present invention to provide a compact diode pulsed laser source incorporating gain-switching and time-lens pulse compression.

A pulsed laser according to the present invention comprises a semiconductor seed pulse source configured for generating relatively long seed pulses via gain-switching as well as a time lens element including at least a phase modulation device and a pulse compressor for shortening the pulses. The seed pulse repetition rate is based upon a clock signal, for example from an RF synthesizer. The clock signal and hence the repetition rate may be variable, for example by using a variable frequency divider such as a variable divide-by-N counter or a phase-locked loop. In a preferred embodiment, the clock signal can vary within the range of 67 kHz to 10 MHz.

The phase modulation device adds chirp to the seed pulses and the pulse compression device compensates for the chirp and produce high peak power, short-duration output pulses. In many preferred embodiments, the duration of the output pulses is less than $\frac{1}{10}$ of the duration of the seed pulse, sometime much less. As a feature, the time lens element also includes an intensity modulation device configured to carve shorter pulses from the seed pulses. One convenient implementation includes only a single intensity modulation device and only a single pulse modulation device.

A modulation driver may be provided to temporally align the intensity modulation device and the phase modulation device. The RF synthesizer may also be used to drive this.

Some embodiments utilize a fiber amplifier, allowing the laser to include no free-space elements. In general, the semiconductor laser is a diode laser.

The pulse compressor may be implemented in a variety of ways, including diffraction gratings, fiber or volume Bragg gratings, a length of dispersive optical fiber, or prisms/grisms.

One preferred embodiment is capable of generating output pulses exceeding 100 pJ, in the range of 900-1000 nm, and can generate output pulses below about 5 ps.

The phase modulation device can be configured to provide programmable chirp according to a variable drive voltage.

One useful device according to the present invention is scanning microscope comprising the pulsed laser described above, along with scanning optics, an objective, a dichroic mirror and a laser reject filter. It may include a photon counting detector attached to the laser reject filter.

One embodiment comprises a compact, pulsed diode laser source suitable for multiphoton microscopy of biological samples. The center wavelength is 976 nm, near the peak of the two-photon cross section of common fluorescent markers such as genetically encoded green and yellow fluorescent proteins. The laser repetition rate is electrically tunable between 66.67 kHz and 10 MHz, with 2.3 ps pulse duration and peak powers >1 kW. The laser components are fiber-coupled and scalable to a compact package. A >600 μm depth penetration is achieved in brain tissue.

DETAILED DESCRIPTION OF THE INVENTION

For two-photon excitation, the number of fluorophores excited per pulse is $$N_{exc} \propto P^2_{ave}/f\tau$$

where $P_{ave}$, f, and τ are the excitation source average power, repetition rate, and pulse duration, respectively. Two-photon excitation scales as the square of the laser power and inversely with both the repetition rate and pulse duration. Increasing the peak power increases the signal-to-noise ratio and therefore the image quality. Table-top multiphoton laser scanning microscopes commonly use mode-locked Ti:sapphire laser systems. While providing femtosecond pulses and >1 MW peak power, optically pumped solid-state lasers such as Ti:sapphire are challenging to miniaturize. In contrast, semiconductor and fiber lasers have potential to be compact and portable and have been demonstrated for two-photon imaging. While mode-locking is an effective method for short pulse generation, the pulse parameters are constrained. The repetition rate is fixed by the laser cavity, while the pulse energy of mode-locked semiconductor lasers is limited by gain saturation and two-photon absorption. Amplified gain-switched semiconductor lasers provide an elegant alternative with arbitrary repetition rate, though the pulse durations are limited to ps. Reaching fs duration using gain-switched pulses requires additional compression, such as using a time-lens.

A time-lens refers to parabolic temporal phase, which causes pulses to compress during propagation through a dispersive medium just as a beam of light is focused by a spatial lens. In contrast to gain-switched lasers, time-lens compression enables electronic control over the pulse parameters, including the pulse repetition rate, duration, and chirp. Time-lens lasers can be entirely fiber coupled and alignment-free. In addition, the time-lens technique is applicable to any seed laser source and does not require specialized semiconductor lasers to generate short gain-switched pulses. Lasers based on the time-lens technique have achieved sub-ps pulses, ~1 W average power, and tunable repetition rate, combining the advantages of mode-locked and gain-switched lasers.

Figure 1:
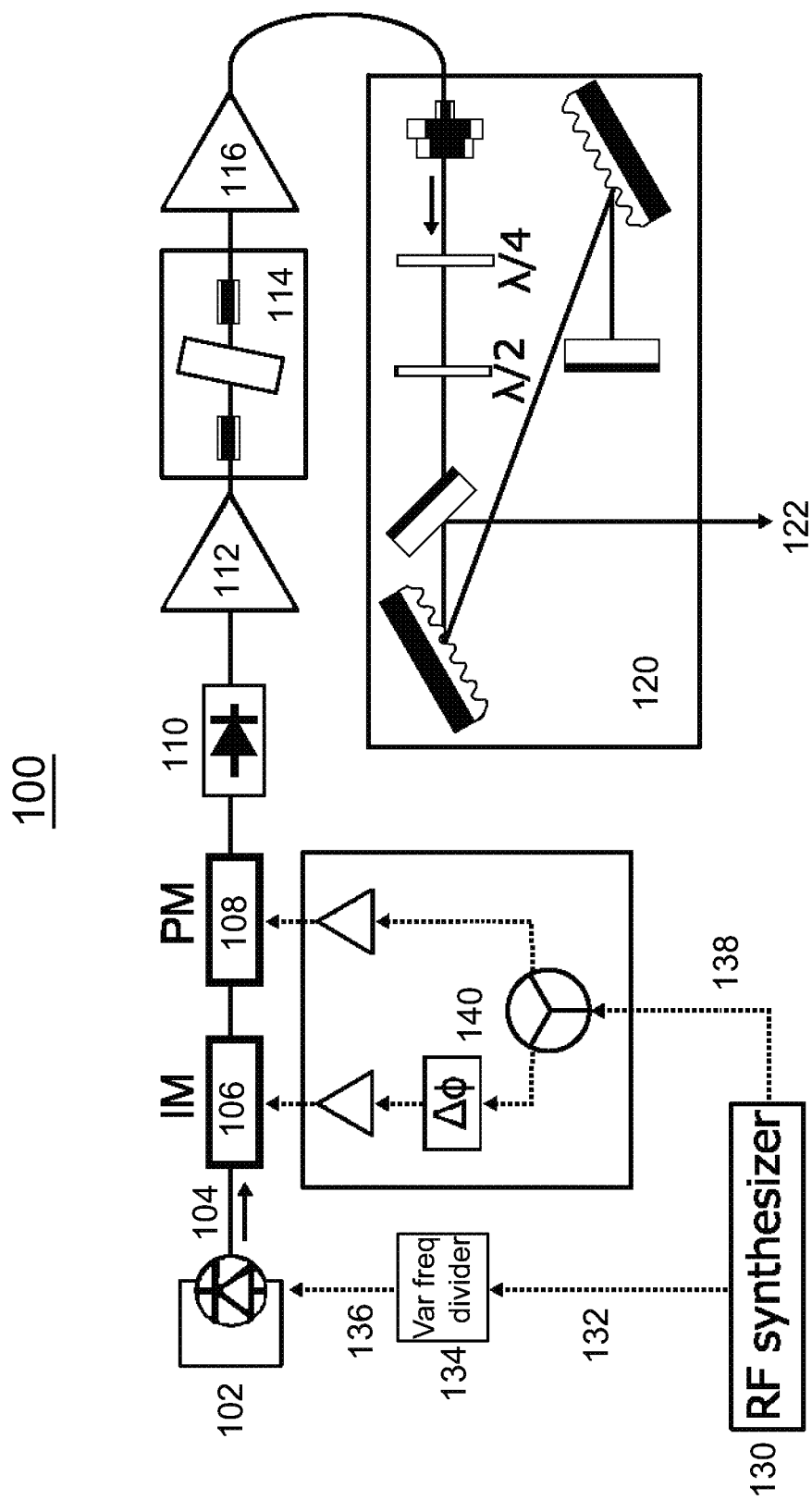
FIG. 1 is a schematic block diagram showing an embodiment of a laser according to the present invention.

FIG. 1 is a schematic block diagram showing an embodiment of a laser 100 according to the present invention. It includes an RF synthesizer 130 for gain switching seed laser 102. Electro-optic intensity modulator 106 and phase modulator 108 (controlled by modulator control signal 138 via modulator driver 140) accomplish time-lens focusing. After amplification by pre-amp 112 and power amplifier 116, compressor 120 produces output pulses 122 which are provided to a microscope or the like. The strong temporal phase modulation broadens the laser spectrum and adds chirp to the pulses. Subsequent group velocity dispersion reduces the pulse duration. To avoid nonlinear effects during compression, dispersion is compensated with a double-pass grating compressor 120. Alternative pulse compressors, including prisms/grisms, fiber or volume Bragg gratings, and dispersive optical fiber, could be used instead of the grating compressor.

The present invention comprises a compact pulsed diode laser source 100 incorporating gain-switching and time-lens pulse compression. In one particularly useful application, the present invention adapts time-lens pulse compression for two-photon fluorescence microscopy. Time-lens lasers are capable of fs pulse durations with arbitrary repetition rates, combining the advantages of mode-locked and gain-switched lasers. In addition, time-lens compression can generate electrically programmable chirp to compensate for dispersion in the microscope components, beyond the mechanical dispersion compensation using prism or grating compressors. In one embodiment, laser 100 operates at 976 nm, which is ideal for two-photon microscopy of common fluorophores. The supplies wavelengths compatible with two-photon excitation of eGFP (enhanced green fluorescent protein). In addition, the laser components are miniaturized and capable of microchip-scale integration.

Laser 100 of FIG. 1 generates 2.3 ps pulses 122 after time-lens compression with peak power exceeding 1 kW and repetition rate tunable between 66.67 kHz and 10 MHz. A wavelength of 976 nm was chosen for one embodiment to match the peak two-photon absorption of common fluorescent markers, including eGFP and YFP (yellow fluorescent protein). Two-photon fluorescence imaging of GFP-labeled mouse brain tissue was demonstrated using laser 100 and a standard laser-scanning microscope (not shown).

A gain-switched diode laser 102 is used as the seed source. Electro-optic intensity and phase modulators (IM 106 and PM 108) are driven at 18 GHz, generating bursts of chirped pulses. The pulse bursts are amplified in Yb:fiber amplifiers (pre-amplifier 112 and power amplifier 116) and compressed with a double-passed grating compressor 120. An isolator 110 separates amplifiers 112, 116 from modulators 106, 108. A spectral filter 114 reduces the amplified spontaneous emission from pre-amp 112. Solid lines indicate the optical path; dashed lines indicate electrical paths.

In one embodiment, seed laser 100 (Innovative Photonic Solutions 10976SB0500P) is gain-switched by a pulsed current source 130 (T165, Highland Technology) producing ~100 ps pulses. Each seed laser pulse 104 is carved into a burst of ~30 ps pulses using electro-optic intensity modulator 106 operating at 18 GHz. The individual pulses in the burst pass through an electro-optic phase modulator 108 also operating at 18 GHz. Intensity modulator 106 is driven at ~20 dBm to maximize the peak-to-background transmission, while phase modulator 108 is driven at the maximum power specification of the modulator, 30 dBm. The peak phase modulation is temporally aligned to the peak intensity using a radio frequency (RF) phase shifter.

Pre-amplifier 112 and power amplifier 116 are based on 10 cm and 16 cm lengths of single-mode Yb:fiber, respectively (YB164, Coractive). Pre-amplifier 112 is pumped with 180 mW at 915 nm, while power amplifier 116 is pumped with ~300 mW at 912 nm. When operating with high gain, the Yb:fiber amplifiers 112, 116 also produce amplified spontaneous emission (ASE), which is reduced by placing bandpass filter 114 between the amplifiers.

Seed laser pulses 104 are triggered by clock signal 132, adjusted to seed laser control signal 136 by variable frequency divider 134. Variable frequency divider 134 could comprise a divide-by-N counter, a phase-locked loop, etc. In the case where variable frequency divider 134 comprises a divide-by-N counter, it enables variation of the pulse repetition rate in, for example submultiples of 10 MHz. Laser 100 was operated between 66.67 kHz and 10 MHz (in some embodiments limited by divide-by-N counter 134), spanning the range typically used for two-photon microscopy.

The single electro-optic phase modulator used here limits the spectral bandwidth and the pulse duration. Sub-ps pulse duration can be achieved by increasing the phase modulation amplitude with additional phase modulators, compensating for higher order dispersion, and compressing the pulses in highly nonlinear optical fiber. The average power could be increased by reducing loss in the compressor or increasing the amount of amplification. Pulse durations on the order of fs are possible using highly nonlinear and/or photonic crystal fibers. Fiber nonlinearity causes intensity-dependent phase modulation that can be combined with a pulse compressor to reduce the pulse duration.

Note that an optically pumped semiconductor laser, an external cavity diode laser, or a quantum cascade laser could be used as seed source 102.

Figure 2B:
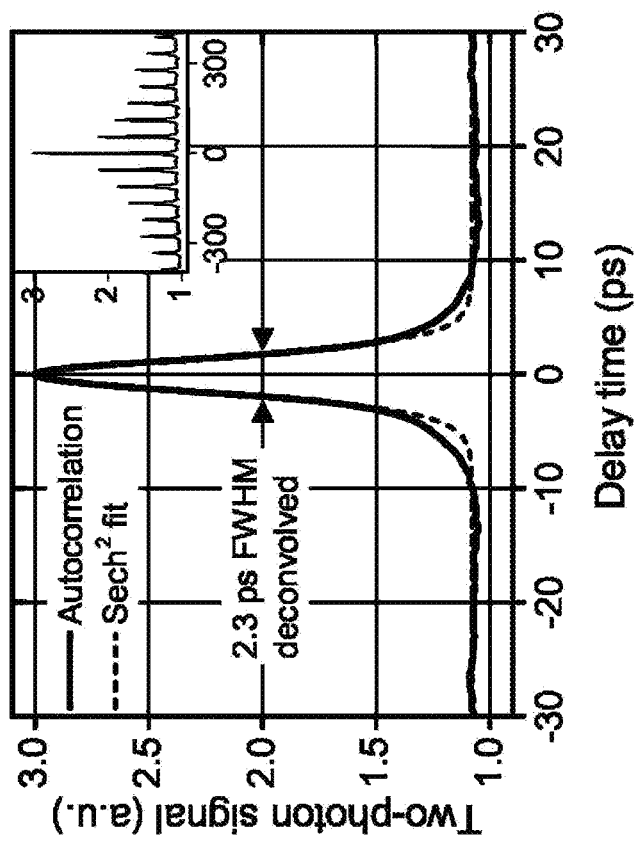
FIG. 2B is a plot showing autocorrelation of the laser source.
Figure 2A:
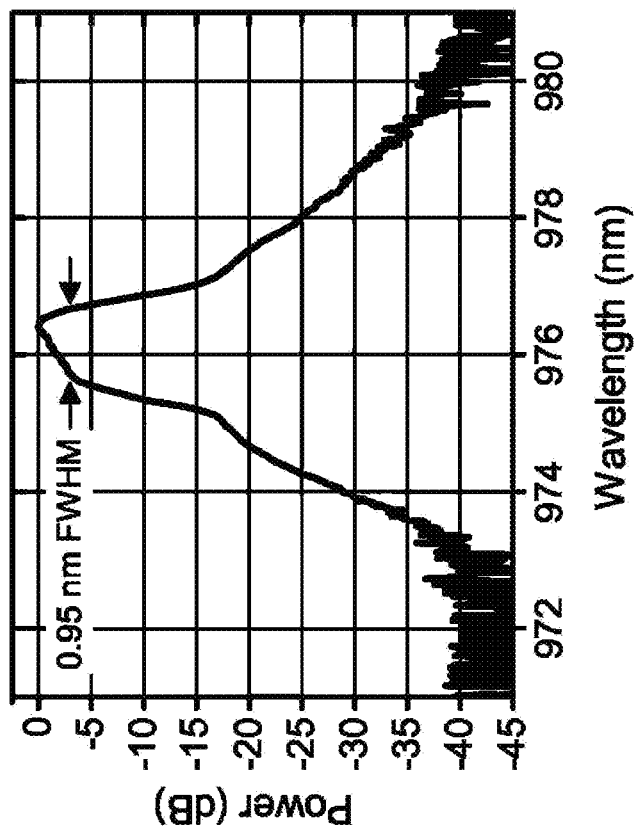
FIG. 2A is a plot showing the optical spectrum of the laser source of FIG. 1.

FIG. 2A is a plot showing the optical spectrum of the laser source of FIG. 1. The spectral bandwidth is 0.95 nm (−3 dB). The resolution bandwidth of the optical spectrum analyzer was 0.08 nm. The compressor is a pair of 1800 l/mm gratings separated by ~30 cm, which provides ~9 ps2 dispersion. The transmission through the compressor is ~40%.

FIG. 2B is a plot showing autocorrelation of the laser source 100 fitted to a sech2 pulse shape (dashed line). The wings of the pulse indicate uncompensated higher order dispersion. The extended autocorrelation (inset) shows the burst duration of ~100 ps. Laser 100 produces short bursts of pulses. FIG. 2B shows the autocorrelation of the primary pulse, while the inset shows the autocorrelation of the pulse bursts, measured after the grating compressor. The burst duration is equal to the duration of the seed laser pulses, ~100 ps, while the individual pulses have 2.3 ps duration. The pulses within the burst are separated by (18 GHz)−1≈55.56 ps. The average power is 30 mW with 30 nJ of pulse energy in each burst and an estimated peak power of ~1.2 kW when operated at a 1 MHz repetition rate. At a 10 MHz repetition rate, the average power is 58 mW, with 5.8 nJ per burst and an estimated peak power of ~300 W. Pulse bursts reduce the peak power and are undesirable for nonlinear microscopy. Driving the electro-optic intensity modulator with a short (~50 ps) electrical pulse would reduce these bursts and concentrate more power in a single pulse.

Figure 3:
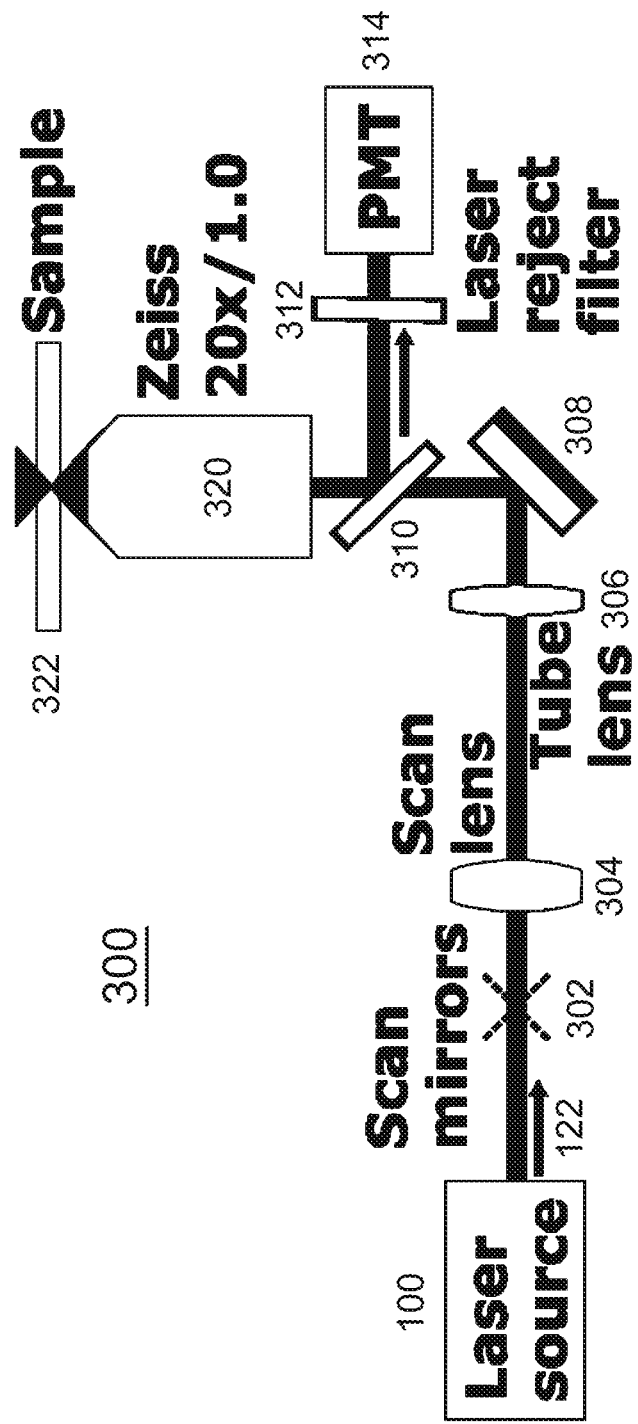
FIG. 3 is a schematic block diagram of a two-photon laser microscope using the laser of FIG. 1.

FIG. 3 is a schematic block diagram of a two-photon laser microscope 300 using laser 100 of FIG. 1. To demonstrate the capabilities of laser 100, the inventors imaged a sample 322 comprising a ~1 mm thick coronal slice of fixed mouse brain tissue from a transgenic mouse line that expresses GFP driven by proteolipid protein (PLP) expression. The mouse was anesthetized with Nembutal (100 mg/kg) and perfused with 4% paraformaldehyde. The fixed brain was dissected out and sliced using a tissue chopper at approximately 1 mm intervals. The slices were mounted in Fluoromount G (SouthernBiotech) under a #1 coverslip. PLP is localized to oligodendrocytes, which are responsible for myelinating axons in the brain and are found with high density throughout the central nervous system.

The microscope setup is shown in FIG. 3. It comprises mirrors 302, 308, 310, lenses 304, 306, objective 320, and laser reject filter 312. The laser output beam 122 was expanded and sent into the Olympus IX71 microscope. The laser under-filled the back of a 20× objective 320 with 1.0 numerical aperture (Zeiss 421452-9880-000, Plan-Apochromat, water immersion). The calculated resolution of the microscope at 976 nm is 410 nm laterally and 1.7 μm axially.

When the two repetition rates were compared with the same average power of 8.5 mW, larger fluorescence signal and faster image acquisition were obtained at 1 MHz repetition rate, due to higher peak power. However, the maximum laser power increases from 30 mW at 1 MHz repetition rate to 58 mW at 10 MHz. At this maximum power, the largest fluorescence signal, best image quality, and fastest frame rate were observed at 10 MHz repetition rate. For the demonstration, laser 100 was operated with these parameters. The total laser power after the objective was 26 mW, corresponding to peak power of ~135 W. The scan optics and objective transmitted 45% of the total power. Laser scanning was controlled with galvonometric mirrors 302, and depth scanning was performed with motorized axial movement of microscope objective 320. Fluorescence was collected back through the same objective, reflected by a dichroic mirror 310 (Chroma T670lpxr-UF3) in a non-descanned geometry, spectrally filtered by laser reject filter 312 (Chroma HQ575/250m-2p), and detected with a photon-counting detector 314 (Hamamatsu H7422-PA-40).

Figure 4A:
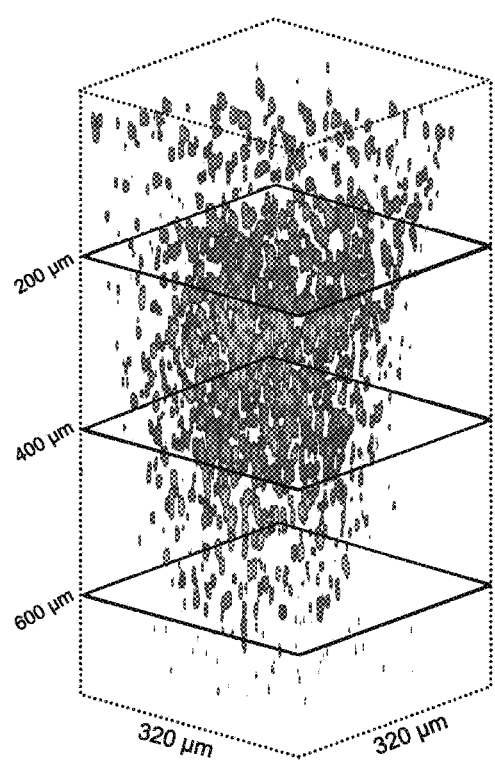
FIG. 4A is a three-dimensional reconstruction of two-photon microscopic imagery.
Figure 4B:
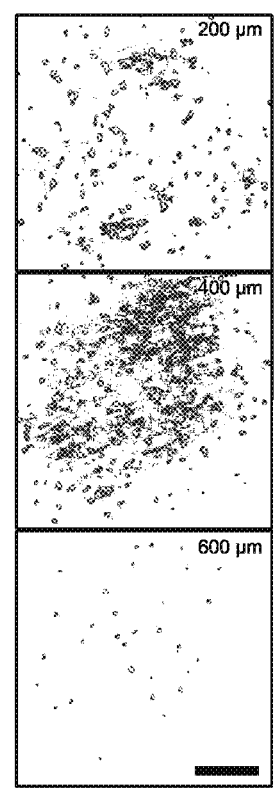
FIG. 4B is individual images at various depths.

FIG. 4A is a three-dimensional reconstruction of tissue from two-photon microscopic imagery from microscope 300. FIG. 4B is individual images at various depths.

In FIG. 4A, the full three-dimensional image resolution is 400 by 400 pixels in the lateral (x,y) dimensions and 350 pixels in the axial (z) dimension. The total field of view is ~320 μm (lateral) with ~0.8 μm pixel spacing and 700 μm (axial) with 2 μm pixel spacing. The dwell time was increased from 10 μs to 100 μs to compensate for attenuation in the tissue as the depth was increased. The frame rate increased correspondingly from 1.6 s to 16 s. FIG. 4A shows a three-dimensional reconstruction of the tissue. The z-axis measures the depth into the tissue and the surface is at z=0. FIG. 4B shows three slices of the 3D volume in xy planes corresponding to the depths 200 μm, 400 μm, and 600 μm. Each image was individually normalized and processed with a median filter with 0.5 pixel radius.

Cells are still visible at 600 μm depth, and the fluorescence signal reduces to the background level beyond 600 μm. The scan depth is limited by the laser power, and increased peak power should enable deeper imaging depths. The acquisition time for the image stack was 77 minutes, but can be improved with increased average power of the source.

The laser system 100 used for this demonstration occupied ~0.5 m2 of table space and could be packaged to fit a standard equipment rack (~0.5 m by ~0.5 m). To reduce the laser size, the pulse compressor is replaced with a fiber-coupled solution such as a Bragg grating or an optical fiber. Additional miniaturization is achieved with compact laser diode mounts, RF components, and spectral filters. A preferred embodiment is a chip-scale source. Because two-photon excitation scales inversely with the product of the repetition rate and the pulse duration (Eq. 1), both ps and fs laser pulses can be effective for multiphoton microscopy. For example, a laser with 1 ps pulses and 10 MHz repetition rate has the same two-photon efficiency per pulse as a laser with 100 fs pulses and 100 MHz repetition rate at the same average power. In addition, ps lasers have narrow bandwidth and can be easily propagated through an optical fiber or optical fiber bundle without distortion. Dispersion compensation for ps pulses is not necessary for fiber-coupled multiphoton microscopes, simplifying design. The miniature pulsed laser source 100 of the present invention has applications for compact multiphoton microscopy systems. As a portable, fiber-coupled system, the laser provides benefit for fiber-coupled multiphoton microscopes or endoscopes for optical biopsy in clinical settings. In addition, the technology has potential for neuroscience studies to image the brain in awake behaving animals, when the laser source is miniaturized to chip scale.

We have demonstrated two-photon fluorescence microscopy of brain cells beyond 600 µm depth in brain tissue with a pulsed semiconductor laser source at 976 nm. The GFP-compatible laser has tunable pulse parameters, including pulse duration (down to 2.3 ps) and repetition rate (66.67 kHz to 10 MHz). The chirp is also programmable by varying the drive voltage of the electro-optic phase modulator. The components are fiber-coupled, alignment-free, and miniaturizable for portable operation. Only one pair of electro-optic intensity and phase modulators are used for increased efficiency, and no specialized laser diodes are required to achieve short pulse durations While the exemplary preferred embodiments of the present invention are described herein with particularity, those skilled in the art will appreciate various changes, additions, and applications other than those specifically mentioned, which are within the spirit of this invention. For example, future designs will use semiconductor amplifiers instead of fiber amplifiers to further improve the device efficiency and performance. The laser design can be extended to other wavelengths to excite other fluorescent molecules or implement three-photon excitation.

What is claimed is:

1. A pulsed laser comprising:
a semiconductor seed pulse source configured for generating seed pulses via gain-switching;
a time lens element including a phase modulation device, a pulse compressor, and an intensity modulation device configured to carve shorter pulses from the seed pulses; and
a clock signal source;
wherein a seed pulse repetition rate is based upon the clock signal;
wherein the phase modulation device adds chirp to the seed pulses; and
wherein the pulse compression device is configured to compensate for the chirp and produce high peak power, short-duration output pulses.

2. The pulsed laser of claim 1 wherein the duration of the output pulses is less than 1/10 of the duration of the seed pulses.

3. The pulsed laser of claim 1 wherein the time lens element includes only a single intensity modulation device and only a single phase modulation device.

4. The pulsed laser of claim 1 further comprising a modulation driver configured to temporally align the intensity modulation device and the phase modulation device.

5. The pulsed laser of claim 1 configured without free-space elements.

6. The pulsed laser of claim 1 configured to generate output pulses exceeding 100 pJ.

7. The pulsed laser of claim 1 configured to generate output pulses in the region of 900-1000 nm.

8. The pulsed laser of claim 1 configured to generate output pulses below about 5 ps.

9. The pulsed laser of claim 1 wherein the phase modulation device is configured to provide programmable chirp according to a variable drive voltage.

10. A pulsed laser comprising:
a semiconductor seed pulse source configured for generating seed pulses via gain-switching;
a time lens element including a phase modulation device and a pulse compressor; and
a clock signal source comprising an RF synthesizer and a variable frequency divider;
wherein a seed pulse repetition rate is based upon the clock signal;
wherein the phase modulation device adds chirp to the seed pulses; and
wherein the pulse compression device is configured to compensate for the chirp and produce high peak power, short-duration output pulses.

11. The pulsed laser of claim 10 wherein the variable frequency divider comprises a variable divide-by-N counter.

12. The pulsed laser of claim 11 wherein the clock signal source produces clock signals within the range of 67 kHz to 10 MHz.

13. The pulsed laser of claim 10 wherein the variable frequency divider comprises a phase-locked loop.

14. The pulsed laser of claim 10 configured without free-space elements.

15. The pulsed laser of claim 10 wherein the pulse compressor comprises one of the following:
diffraction gratings;
a fiber Bragg grating;
a volume Bragg grating;
a length of dispersive optical fiber;
prisms; or
grisms.

16. The pulsed laser of claim 1 configured to generate output pulses exceeding 100 pJ.

17. The pulsed laser of claim 1 configured to generate output pulses in the region of 900-1000 nm.

18. The pulsed laser of claim 1 configured to generate output pulses below about 5 ps.

19. The method of generating pulses comprising the steps of:
(a) generating seed pulses with a gain-switched semiconductor laser;
(b) generating a clock signal with an RF synthesizer and a variable frequency divider and basing a seed pulse repetition rate upon the clock signal;
(c) applying chirp to the seed pulses;
(d) compressing the chirped pulses to compensate for the chirp and produce high-power short-duration output pulses.

20. The method of claim 19 wherein the variable frequency divider comprises a divide-by-N counter.

21. The method of claim 19 wherein the variable frequency divider comprises a phase-locked loop.

* * * * *